United States Patent [19]

Czubatjy et al.

[11] Patent Number: 5,743,970
[45] Date of Patent: Apr. 28, 1998

[54] PHOTOVOLTAIC MODULE HAVING AN INJECTION MOLDED ENCAPSULANT

[75] Inventors: Wolodymyr Czubatjy, Warren; Joachim Doehler, Union Lake, both of Mich.

[73] Assignee: Energy Conversion Devices, Inc., Troy, Mich.

[21] Appl. No.: 571,338

[22] Filed: Dec. 13, 1995

[51] Int. Cl.⁶ .................................................. H01L 31/048
[52] U.S. Cl. ...................................... 136/251; 257/433
[58] Field of Search ............................ 136/251, 259; 257/433

[56] References Cited

U.S. PATENT DOCUMENTS

| | | | |
|---|---|---|---|
| 4,830,038 | 5/1989 | Anderson et al. | 136/251 |
| 5,008,062 | 4/1991 | Anderson et al. | 264/272.15 |

FOREIGN PATENT DOCUMENTS

| | | | |
|---|---|---|---|
| 2757765 | 2/1979 | Germany | 136/251 |
| 2757493 | 6/1979 | Germany | 136/246 |

*Primary Examiner*—Aaron Weisstuch
*Attorney, Agent, or Firm*—David W. Schumaker; Marvin S. Siskind; Marc J. Luddy

[57] ABSTRACT

A photovoltaic module which includes at least one photovoltaic cell which is encapsulated in a non-reacted, injection molded polymeric material, thereby forming an environmental seal around the cell. The photovoltaic cell(s) are incorporated into a photovoltaic panel having front and back sides and edges forming a perimeter, and also includes means for external electrical connection to the photovoltaic cell. The non-reacted injection molded polymeric material encapsulating the panel may form useful structures, such as shingles, blocks, cases, or boxes.

12 Claims, 1 Drawing Sheet

PHOTOVOLTAIC MODULE HAVING AN INJECTION MOLDED ENCAPSULANT

GOVERNMENT INTEREST

This invention was made with Government support under DOD Contract No. MDA-911-94-C-0063, awarded by SOCOM. The Government has certain rights in this invention.

FIELD OF THE INVENTION

This invention relates generally to photovoltaic modules and more specifically to modules which are encapsulated by a non-reacted injection molded polymeric material. The encapsulant acts both as an environmental shield to protect the photovoltaic cell from the elements during use as well as mechanical support and protection.

BACKGROUND OF THE INVENTION

Photovoltaic energy conversion (PV), the direct conversion of sunlight to electricity, has long been a source of energy in space. However, it has traditionally been too costly to be practiced for terrestrial applications except in remote locations. Growing awareness of and concern over the environmental consequences of conventional and nuclear power generation and the desire to reduce reliance on imported oil have increased the need for practical, affordable renewable energy technologies. The nation which first succeeds at developing and commercializing a low-cost practical PV technology that is competitive with conventional fuels will be at the forefront of a worldwide energy revolution with enormous economic consequences.

The worldwide shipment of PV modules in 1993 was approximately 60 MW, which amounted to a dollar value of about $300 million; including the balance of systems, the total market was $600 million. U.S. companies had approximately a 20% share of this market. According to U.S. Department of Energy (DOE), PV is going to play an increasingly important role for the utilities and other end users of electricity because of the need for new electricity generating capacity coupled with the heightened awareness of the environmental impacts associated with energy use from conventional sources. The new capacity need for U.S. utilities alone is 600 MW in the 1990's, and for more than two thirds of the utilities, the additional yearly need is less than 100 MW. The modular characteristics of PV makes it ideally suitable for these applications, and DOE estimate for PV in the U.S. utility market alone is 900 MW of cumulative power installation in the 1990's. Enormous opportunities also exist in Latin America, Asia and Africa for remote power applications; the U.S. Agency for International Aid (USAID) forecasts that the market for power generation systems between 1990 and 2010 in the developing world alone will be $914 billion. Distributed power is the most desirable mode of electricity generation in many of these countries, and that makes PV systems very attractive. According to DOE estimates, the cumulative demand for PV in these countries for the 1990's is 500 MW. This is an enormous export market which the U.S. cannot afford to ignore.

In order to address this multimillion dollar market in PV, an essential requirement is the lowering of cost of PV modules from the prevailing $4 to $5 per watt to less than $1 per watt. This challenge can only be met by aggressive R&D undertaken by PV industries to develop innovative manufacturing technology addressing issues involving cost, module efficiency and reliability.

During the last three decades, many different approaches have been pursued to reduce the cost of PV. In order for PV to be cost effective and accepted as a viable source of alternative energy, the following key requirements need to be fulfilled: (1) low material cost, (2) high efficiency with good stability, (3) low-cost manufacturing process with high yield, and (4) environmental safety. It is important to point out that all these requirements need to be fulfilled in order for PV to be accepted for large-scale terrestrial applications.

One area in which the cost of photovoltaic modules can be reduced is the encapsulation and framing of photovoltaic modules. While existing methods for the production and framing of photovoltaic panels have provided significant improvements in solar cell technology over the years, it has been desired to simplify the lamination and manufacture of such panels and provide for a stronger module and a more perfect seal to protect the photovoltaic panels. For example, the lamination steps have previously required a considerable expenditure of labor, and the metal backing sheets previously used to protect the back of the panel may allow electrical leakage which turns a photovoltaic cell into a capacitor.

A specific example of one typical lamination/module-formation process is described in U.S. Pat. No. 4,773,944 issued to Nath et al., the disclosure of which is herein incorporated. Nath et al. disclose that once the photovoltaic cell is formed, then a layer of lightweight, durable, readily formable lower laminate material is laminated thereonto. The lower laminate is typically aluminum, although it may also be other materials such as galvanized steel or plastic. The lower laminate should be capable of withstanding harsh environmental conditions, be formable into a variety of shapes, and be capable of rigidly maintaining the shapes into which it has been formed. Upon the upper surface of the lower laminate, a layer of a dielectric material, for instance a flowable organic resin such as ethyl vinyl acetate (EVA), is deposited.

After the deposition of the layer of flowable organic resin an intermediate layer of insulating material is applied between the photovoltaic cell and the organic resin to further electrically insulate the lower laminate from the current photogenerated by the photovoltaic cell. The intermediate layer of insulating material which is deposited upon the layer of flowable organic resin can be TEDLAR (registered Trademark of DuPont Corp.).

Atop the intermediate layer of insulating material, a second layer of flowable organic resin is deposited. The second layer of flowable organic resin material can also be ethyl vinyl acetate (EVA) and said resin is employed as an adhesive to bind the intermediate layer to the lower surface of the photovoltaic cell while the previously applied layer of flowable organic resin is employed as an adhesive to bind the lower laminate to the intermediate layer. Finally, the photovoltaic cell is placed atop said organic resin.

In order to complete the encapsulation process, it is then necessary to deposit a layer of flowable organic resin (i.e. EVA) to the upper surface of the photovoltaic cell. Finally, a layer of relatively hard, durable, flexible, optically transparent material is deposited upon the uppermost layer of EVA. The relatively hard, durable layer can be a layer of TEDLAR.

After completing the lamination process as described in the paragraphs hereinabove, it remains necessary to form the laminated photovoltaic module into a shape and size suitable for use in a particular application. Therefore, the laminated modules are cut into planar sheets which can then be formed by bending the peripheral edge portions thereof into a three dimensional, volumetric configuration such a rectangular parallelepiped. In order to be sure that said module maintains the rectangular, three-dimensional shape, the peripheral edge portions (which edge portions or skirts depend at a 90° angle from the planar face of the module) are riveted at the four corners thereof.

While these modules are useful, their application is limited and the method used for forming them is costly with respect to both materials and processing.

A less process intensive method for protecting the photovoltaic cells was developed in the late 1980's. This method employed reactive injection molding (RIM) to mold a polymeric encapsulant around the photovoltaic cell. This polymeric encapsulant acts as both an environmental shield to protect the photovoltaic cell from the environment and as a mechanical support for the photovoltaic cell. The RIM encapsulated module and the method for forming such modules are disclosed in U.S. Pat. Nos. 4,830,038 and 5,008,062, respectively, each issued to Anderson, et al., the disclosures of which are hereby incorporated by reference.

In the reactive injection molding (RIM) process a RIM machine meters, mixes and dispenses reactive chemicals into a mold, where a chemical reaction occurs and the desired part is formed. That is, the mixing of the reactants occurs in the mix head and continues after injection within the mold. The mold shapes the part, directs reactants into the mold cavity, directs the flow of reactants, and controls the reaction temperature produced by the molding process by removing heat.

While this process is more adaptable that those of the prior art, it cannot be said to reduce the cost of the finished photovoltaic panel to a significant degree. This is due to the high cost of the reactive chemicals which are required to form the polymeric encapsulant. For instance, commercial RIM polyurethane polymer precursors are based on isocyanates, polyols, extenders, catalysts and blowing agents. The extenders are usually glycols or amines or some combination of the two. While typically being expensive, many of these chemical are also very dangerous and even toxic.

Even so, Anderson et al. suggest that this is the only means by which an injection molded encapsulant may be formed around a photovoltaic cell. Anderson et al. reason that:

The RIM process is particularly advantageous in encapsulating photovoltaic panels since RIM is a thermosetting polymer formed from the reaction of injected liquid polymeric precursors at low temperature (less than 200° F.), thus preventing heat damage to the thin film material which would occur if high temperature injection molding techniques were employed.

However, the instant inventors have found, contrary to what Anderson et al. have taught, that conventional injection molding (i.e. non-reactive injection molding) may be used to encapsulate photovoltaic cells without damage to thereto.

SUMMARY OF THE INVENTION

The instant invention consists of a photovoltaic module which includes at least one photovoltaic cell which is encapsulated in a non-reacted, injection molded polymeric material, thereby forming an environmental seal around the cell. The photovoltaic cell(s) are incorporated into a photovoltaic panel having front and back sides and edges forming a perimeter, and also includes means for external electrical connection to the photovoltaic cell.

Preferably the photovoltaic cell(s) are thin film amorphous, silicon cell such as a single, tandem dual, or tandem triple PIN junction thin film amorphous silicon cell. The non-reacted injection molded polymeric material which encapsulates the photovoltaic panel is preferably capable of being injection molded at a temperature of less than about 500° F. and is a clear, light-transmissive polymeric material such as a clear ABS material. If desired, the portion of the non-reacted injection molded polymeric material which encapsulates the photovoltaic panel and is adjacent to the non-light incident side thereof can include a colored pigment.

The non-reacted injection molded polymeric material encapsulating the panel may form useful structures, such as shingles, blocks, cases, or boxes.

DETAILED DESCRIPTION OF THE INVENTION

Figure 1:
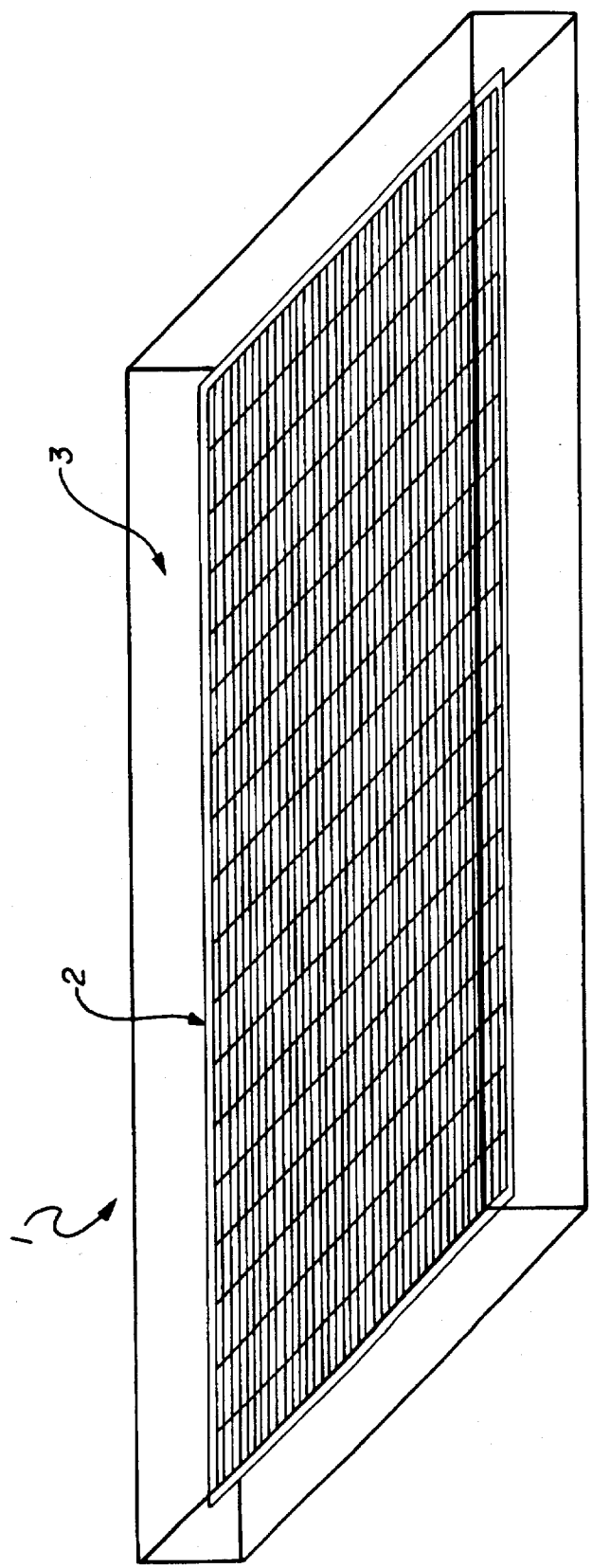
FIG. 1 is a schematic depiction, not to scale, of a polymer encapsulated photovoltaic panel according to the instant invention.

The instant invention relates to polymer encased photovoltaic modules, and more specifically to non-reacted, injection molded polymer encased photovoltaic modules. Referring to FIG. 1, the encased photovoltaic module 1 includes a photovoltaic panel 2 and a non-reacted, clear, light transmissive polymer material 3 encasing the photovoltaic panel 2.

The polymer material 3 forms a non-reacted injection molded encasement around the photovoltaic panel 2 protecting it from both the environment and mechanical abrasion. Additionally the polymer encasement 3 can act as a support for the photovoltaic panel 2 when rigidity is required. However, in some end use applications flexibility may be more desirable. In these instances, the polymer encasement 3 may be thin enough to allow for the required flexibility.

The photovoltaic panel 2 is preferably a standard amorphous silicon panel, which is well known in the art. Such a panel is formed from at least one photovoltaic cell. The photovoltaic cell(s) are typically formed by depositing a PIN type amorphous silicon photovoltaic cell onto a heat resistant substrate such as a stainless steel web. The photovoltaic cell(s) may be single PIN junctions or may be dual or triple tandem cell(s). Each of these are well known in the art and need not be further discussed herein.

The photovoltaic panel 2 can generically be described as having a front, light-incident side (i.e. where the photovoltaic cell is deposited), and back (non-light-incident) side and edges which form a periphery.

The polymer encasement 3 may be clear (light-transmissive) everywhere or may have added pigments on the back (non-light-incident) side of the photovoltaic panel. Addition of the pigment may be useful in some applications which require visual aesthetics.

One such instance is when the wiring and interconnects on the back (non-light-incident) side needs to be hidden for aesthetics. That is, because the wiring and interconnects of typical photovoltaic panels are on the back side, they can be hidden from view by adding a pigment to the polymer material which covers the back of the panel while the clear polymer on the front side will still allow light to reach the photovoltaic cell(s). It should also be noted that there will be at least two holes (not shown) in the polymer material to allow for external electrical connection to the photovoltaic module 1.

Another user application in which it would be useful to pigment the back side of the polymer encasement 3 is when it is desirable to hide the background behind the panel from view. That is, for example, when the panel is used for construction applications such as roofing, paneling, siding, etc.

Producing the encapsulated photovoltaic module 1 is relatively simple. The formed pre-fabricated photovoltaic panel 2 (and any required interconnections between cells) is placed in a mold. The panel may be placed upon a backing plate or other support structure within the mold as required. Mold inserts to form the external electrical connection openings may also be added. The encasement 3 is injection molded from molten polymer material. The encasement 3 may be molded in a single step or in multiple steps. When a pigment is to be added to the polymer on the back of the panel is will likely be easiest to mold the front and back portions of the encasement 3 separately.

The polymer material disclosed herein is a clear acrylonitrile-butadiene-styrene copolymer (ABS) material. However, any polymer may be used as long as its viscosity is low enough (at a temperature of less than about 500° F.) that it can be injection molded around the photovoltaic panel 2. Other applicable polymers include carbonates, acrylics, acrylonitriles, styrenes, acrylates, butadienes, vinyls, etc.

Additionally, a layer of polymer material may be laminated to the light incident surface of the photovoltaic panel before encapsulation by the non-reacted, injection molded polymer. This material can assist in bonding the encapsulant polymer to the panel, thereby avoiding optical decoupling caused by delamination of the panel and the encapsulant. Optical decoupling can reduce the energy output of the photovoltaic panel and should therefore be avoided if possible. Although many polymeric materials may be useful in reducing this optical decoupling, a preferred material is ethyl vinyl acetate (EVA).

EXAMPLE

A panel formed from standard triple junction tandem PIN type amorphous silicon photovoltaic cells deposited onto a heat resistant stainless steel substrate was placed into an injection mold. Pins were inserted into the mold to leave electrical connector openings in the back of the molded article for electrical connection to the finished module. Clear ABS material was then injected into the mold to encapsulate the photovoltaic panel. The injector nozzle temperature was set at 472° F. The injection began at 1000 psi for 2.5 seconds, which filled the mold to 80%. The pressure was then increased to 3500 psi for 1.5 seconds to fill the mold to 100%. Then the pressure was reduced to 3000 psi and held for 2.0 seconds to allow all small features to fill. Injector pressure was then discontinued and the molded article was allowed to stand in the mold for 50 seconds to cure. The molded panel was then removed and allowed to cool to room temperature.

The electrical characteristics of the molded photovoltaic module were compared with the characteristics of the photovoltaic panel before encapsulation. It was found that the modules could be made with no loss of electrical characteristics. That is, comparison of the initial unencapsulated photovoltaic panel and the final encapsulated photovoltaic module showed that the open circuit voltage, the short circuit current, and the current at 12 volts remained constant.

Therefore, it can clearly be seen that the non-reacted, injection molded photovoltaic modules of the present invention show tremendous promise for commercial, industrial, and consumer uses. Particularly, they may be useful as construction materials for any applications in which integrated power is useful. Specific applications include building materials, such as roofing, integrating power into portable, plastic encased equipment, and any other application where it is useful to provide physical structure as well as power generation. Specifically useful structures would include shingles, blocks, cases or boxes.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. A photovoltaic module comprising:
   a photovoltaic panel having front and back sides and edges forming a perimeter and at least one photovoltaic cell capable of converting radiation incident the front side of the panel to electrical energy; and
   a non-reacted injection molded polymeric material encapsulating said panel and forming an environmental seal therearound,
   wherein said non-reacted injection molded polymeric material encapsulating said panel is injection molded in-situ around said panel.

2. The photovoltaic module of claim 1, wherein the panel further includes means for establishing external electrical connection to said at least one photovoltaic cell.

3. The photovoltaic module of claim 1, wherein said photovoltaic cell comprises a thin film amorphous silicon cell.

4. The photovoltaic module of claim 3, wherein said photovoltaic cell is a single PIN junction thin film amorphous silicon cell.

5. The photovoltaic module of claim 3, wherein said photovoltaic cell is a tandem dual PIN junction thin film amorphous silicon cell.

6. The photovoltaic module of claim 3, wherein said photovoltaic cell is a triple PIN junction thin film amorphous silicon cell.

7. The photovoltaic module of claim 1, wherein said non-reacted injection molded polymeric material which encapsulates the photovoltaic panel is capable of being injection molded at a temperature of less than about 500° F.

8. The photovoltaic module of claim 7, wherein said non-reacted injection molded polymeric material which encapsulates the photovoltaic panel is a clear, light-transmissive polymeric material.

9. The photovoltaic module of claim 7, wherein said non-reacted injection molded polymeric material which encapsulates the photovoltaic panel comprises a clear acrylonitrile-butadiene-styrene material.

10. The photovoltaic module of claim 7, wherein the portion of said non-reacted injection molded polymeric material which encapsulates the photovoltaic panel and is adjacent the non-light incident side thereof includes a colored pigment.

11. The photovoltaic module of claim 1, wherein a layer of polymeric material is laminated onto the front of said photovoltaic panel, said laminated polymeric material assisting in optical coupling of said photovoltaic panel and said non-reacted injection molded polymeric material encapsulating said panel.

12. The photovoltaic module of claim 1, wherein said non-reacted injection molded polymeric material encapsulating said panel forms a useful structure selected from the group consisting of shingles, blocks, cases, and boxes.

* * * * *